(12) United States Patent
Fukuda

(10) Patent No.: US 9,983,466 B2
(45) Date of Patent: May 29, 2018

(54) COOLING DEVICE AND PROJECTION DISPLAY DEVICE

(71) Applicant: JVC KENWOOD Corporation, Yokohama-shi, Kanagawa (JP)

(72) Inventor: Mitsuharu Fukuda, Yokohama (JP)

(73) Assignee: JVC KENWOOD Corporation, Yokohama-shi (JP)

( * ) Notice: Subject to any disclaimer, the term of this patent is extended or adjusted under 35 U.S.C. 154(b) by 0 days. days.

(21) Appl. No.: 15/454,935

(22) Filed: Mar. 9, 2017

(65) Prior Publication Data

US 2017/0277027 A1    Sep. 28, 2017

(30) Foreign Application Priority Data

Mar. 24, 2016 (JP) .................................. 2016-059754

(51) Int. Cl.
| | |
|---|---|
| G03B 21/16 | (2006.01) |
| F21V 29/60 | (2015.01) |
| F21V 29/76 | (2015.01) |
| F28D 15/02 | (2006.01) |
| F28F 1/32 | (2006.01) |
| F28D 15/00 | (2006.01) |

(52) U.S. Cl.
CPC .............. *G03B 21/16* (2013.01); *F21V 29/60* (2015.01); *F21V 29/76* (2015.01); *F28D 15/00* (2013.01); *F28D 15/0266* (2013.01); *F28F 1/325* (2013.01)

(58) Field of Classification Search
CPC .. G03B 21/16; G03B 21/145; G03B 21/2033; H04N 9/3144; H04N 9/3164; H01L 23/427; H01L 23/467; H01L 23/473; H01L 23/3672
See application file for complete search history.

(56) References Cited

U.S. PATENT DOCUMENTS

| | | | |
|---|---|---|---|
| 6,657,859 B1 * | 12/2003 | Karr ........................ | G06F 1/203 165/104.21 |
| 2004/0165350 A1 | 8/2004 | Fan | |
| 2006/0209266 A1 | 9/2006 | Utsunomiya | |
| 2007/0024814 A1 * | 2/2007 | Woo ........................ | G03B 21/16 353/52 |

(Continued)

FOREIGN PATENT DOCUMENTS

| | | |
|---|---|---|
| JP | 2003-075081 A | 3/2003 |
| JP | 2009-238948 A | 10/2009 |

*Primary Examiner* — Sultan Chowdhury
(74) *Attorney, Agent, or Firm* — Procopio, Cory, Hargreaves and Savitch LLP

(57) ABSTRACT

A cooling device includes a duct with one opened end and another opened end; a fan disposed inside the duct, the fan being configured to send air present inside the duct in an air-sending direction; a heat sink disposed outside the duct, the heat sink including a base part having an opposed surface opposed to a mouth of the another end of the duct, and heat-sink fins including a plurality of thin plates extending from the opposed surface along the air-sending direction; a heat source in contact with the base part; a heat pipe connected to the heat source or the heat sink; and heat-pipe fins disposed between the fan and the one end of the duct inside the duct, the heat-pipe fins including a plurality of thin plates extending from the heat pipe along the air-sending direction.

7 Claims, 11 Drawing Sheets

(56) References Cited

U.S. PATENT DOCUMENTS

| | | | | |
|---|---|---|---|---|
| 2008/0055563 A1* | 3/2008 | Momose | ............... | G03B 21/16 |
| | | | | 353/61 |
| 2012/0133907 A1* | 5/2012 | Otani | .................... | G03B 21/16 |
| | | | | 353/58 |
| 2013/0027881 A1* | 1/2013 | Goto | ....................... | G06F 1/203 |
| | | | | 361/697 |
| 2014/0092368 A1* | 4/2014 | Dai | ........................ | G03B 21/16 |
| | | | | 353/58 |

* cited by examiner

| | DISCHARGING-SIDE HEATSINK | DISCHARGING-SIDE FIN (CROSS SECTION RATIO) | FAN CROSS SECTION RATIO | INTAKE-SIDE FIN (CROSS SECTION RATIO) | AIR VOLUME % | THERMAL RESISTANCE % |
|---|---|---|---|---|---|---|
| A | NOT PROVIDED | NOT PROVIDED | 1 | NOT PROVIDED | 100 | — |
| B | NOT PROVIDED | PROVIDED (1) | 1 | NOT PROVIDED | 89 | — |
| C | NOT PROVIDED | NOT PROVIDED | 1 | PROVIDED (1) | 87 | — |

Fig. 5A

| | DISCHARGING-SIDE HEATSINK | DISCHARGING-SIDE FIN (CROSS SECTION RATIO) | FAN CROSS SECTION RATIO | INTAKE-SIDE FIN (CROSS SECTION RATIO) | AIR VOLUME % | THERMAL RESISTANCE % |
|---|---|---|---|---|---|---|
| D | NOT PROVIDED | NOT PROVIDED | 0.60 | NOT PROVIDED | 100 | — |
| E | NOT PROVIDED | PROVIDED (1) | 0.60 | NOT PROVIDED | 94 | — |
| F | NOT PROVIDED | NOT PROVIDED | 0.60 | PROVIDED (1) | 92 | — |

Fig. 5B

| | DISCHARGING-SIDE HEATSINK | DISCHARGING-SIDE FIN (CROSS SECTION RATIO) | FAN CROSS SECTION RATIO | INTAKE-SIDE FIN (CROSS SECTION RATIO) | AIR VOLUME % | THERMAL RESISTANCE % |
|---|---|---|---|---|---|---|
| G | PROVIDED | NOT PROVIDED | 0.60 | NOT PROVIDED | 100 | 100 |
| H | PROVIDED | PROVIDED (1) | 0.60 | NOT PROVIDED | 92 | 109 |
| I | PROVIDED | NOT PROVIDED | 0.60 | PROVIDED (1) | 94 | 104 |

Fig. 5C

COOLING DEVICE AND PROJECTION DISPLAY DEVICE

CROSS REFERENCE TO RELATED APPLICATION

This application is based upon and claims the benefit of priority from Japanese patent application No. 2016-059754, filed on Mar. 24, 2016, the disclosure of which is incorporated herein in its entirety by reference.

BACKGROUND

The present invention related to a cooling device and a projection display device. For example, the present invention relates to a cooling device that cools a light source of a projector and a projection display device.

Semiconductor light sources such as lasers and light emitting diodes (LEDs) have been increasingly used as light sources of projectors. Since a semiconductor light source has a high heat-generating density, it is cooled by using a radiator. Examples of disclosed cooling structures include a structure in which a radiator such as a heat sink is connected to a heat source and air is sent to the radiator, and a structure for cooling a light-source lamp by using a heat pipe.

Japanese Unexamined Patent Application Publication No. 2003-075081 discloses a projection display device 4 including a lamp 5, which is a heat source, a heat-receiving block 42 to which the heat source is connected, a heat sink 47 including a plurality of radiation fins 48 disposed therein, and an exhaust fan 49 for sending air to the heat sink 47 and thereby causing heat to radiate therefrom as shown in FIGS. 8A and 8B. The projection display device 4 disclosed in Japanese Unexamined Patent Application Publication No. 2003-075081 transfers heat generated in the heat source to the heat sink 47 through the heat-receiving block 42 and heat pipes 43, and causes the transferred heat to externally radiate from the heat sink 47 by using the exhaust fan 49.

Further, Japanese Unexamined Patent Application Publication No. 2009-238948 discloses a heat sink equipped with fins, including an axial fan with an air-inlet and an air-outlet formed therein, first radiation fins disposed in the air-inlet, second radiation fins disposed in the air-outlet, a heat pipe connecting the first radiation fins with the second radiation fins, and a heat-receiving block joined to the heat pipe. The heat sink equipped with fins transfers heat generated in a heat source to the first and second radiation fins through the heat pipe, and causes the transferred heat to externally radiate from the first and second radiation fins by using an exhaust fan 49.

It should be noted that when the size of radiation fins disposed in a heat sink and/or a heat pipe is increased to increase the cooling efficiency of the radiation fins, the radiation efficiency does not improve when the size of the radiation fins reaches a certain size and the radiation efficiency saturates there. Further, when the size of radiation fins is increased, their air resistance increases, thus causing a problem that even when the volume of air is increased, the radiation cannot be improved in accordance with the size of the radiation fins.

The present invention has been made to solve the above-described problem and an object thereof is to provide a cooling device and a projection display device capable of improving the cooling performance of a heat source.

SUMMARY

A cooling device according to an embodiment includes a duct with one opened end and another opened end; a fan disposed inside the duct, the fan being configured to send air present inside the duct in an air-sending direction, the air sending direction being a direction connecting the one end of the duct with the another end thereof; a heat sink disposed outside the duct, the heat sink including a base part having an opposed surface opposed to a mouth of the another end of the duct, and heat-sink fins including a plurality of thin plates extending from the opposed surface along the air-sending direction, the plurality of thin plates being apart from each other by a predetermined distance; a heat source in contact with the base part; a heat pipe connected to the heat source or the heat sink; and heat-pipe fins disposed between the fan and the one end of the duct inside the duct, the heat-pipe fins including a plurality of thin plates extending from the heat pipe along the air-sending direction, the plurality of thin plates being apart from each other by a predetermined distance.

The above and other objects, features and advantages of the present invention will become more fully understood from the detailed description given hereinbelow and the accompanying drawings which are given by way of illustration only, and thus are not to be considered as limiting the present invention.

BRIEF DESCRIPTION OF THE DRAWINGS

FIG. 5A is a table showing an example of a simulation result of a relation between each of disposition patterns of a heat sink, a fan and heat-pipe fins, and the volumes of air and the thermal resistance in that disposition pattern;

FIG. 5B is a table showing an example of a simulation result of a relation between each of disposition patterns of a heat sink, a fan and heat-pipe fins, and the volumes of air and the thermal resistance in that disposition pattern;

FIG. 5C is a table showing an example of a simulation result of a relation between each of disposition patterns of a heat sink, a fan and heat-pipe fins, and the volumes of air and the thermal resistance in that disposition pattern;

DETAILED DESCRIPTION

Exemplary Embodiments

A cooling device according to an exemplary embodiment is explained. The cooling device according to the exemplary embodiment is, for example, a cooling device that cools a light source of a projector. Firstly, a configuration of the cooling device according to the exemplary embodiment is explained.

Figure 1:
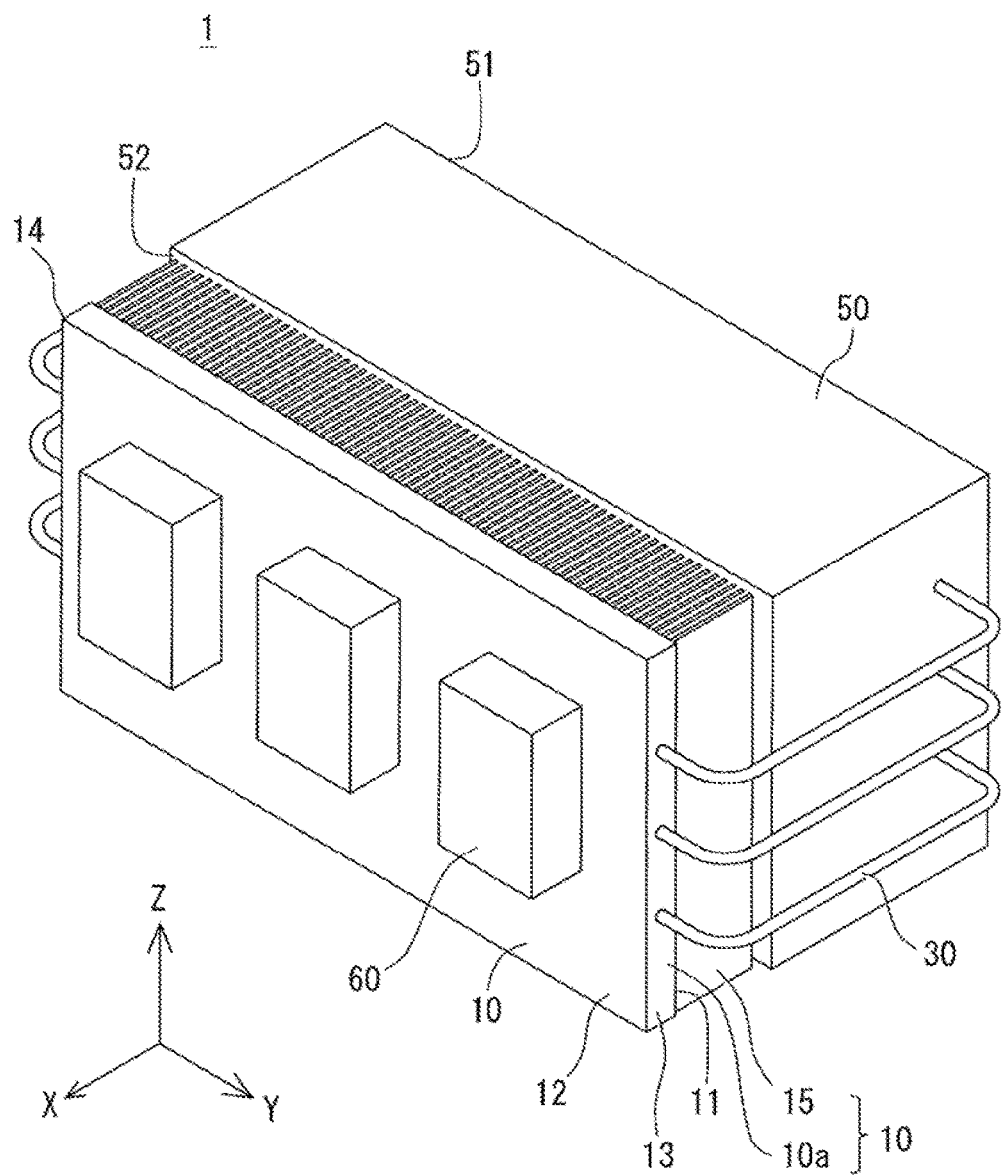
FIG. 1 is a perspective view showing an example of a cooling device according to an exemplary embodiment.
Figure 2:
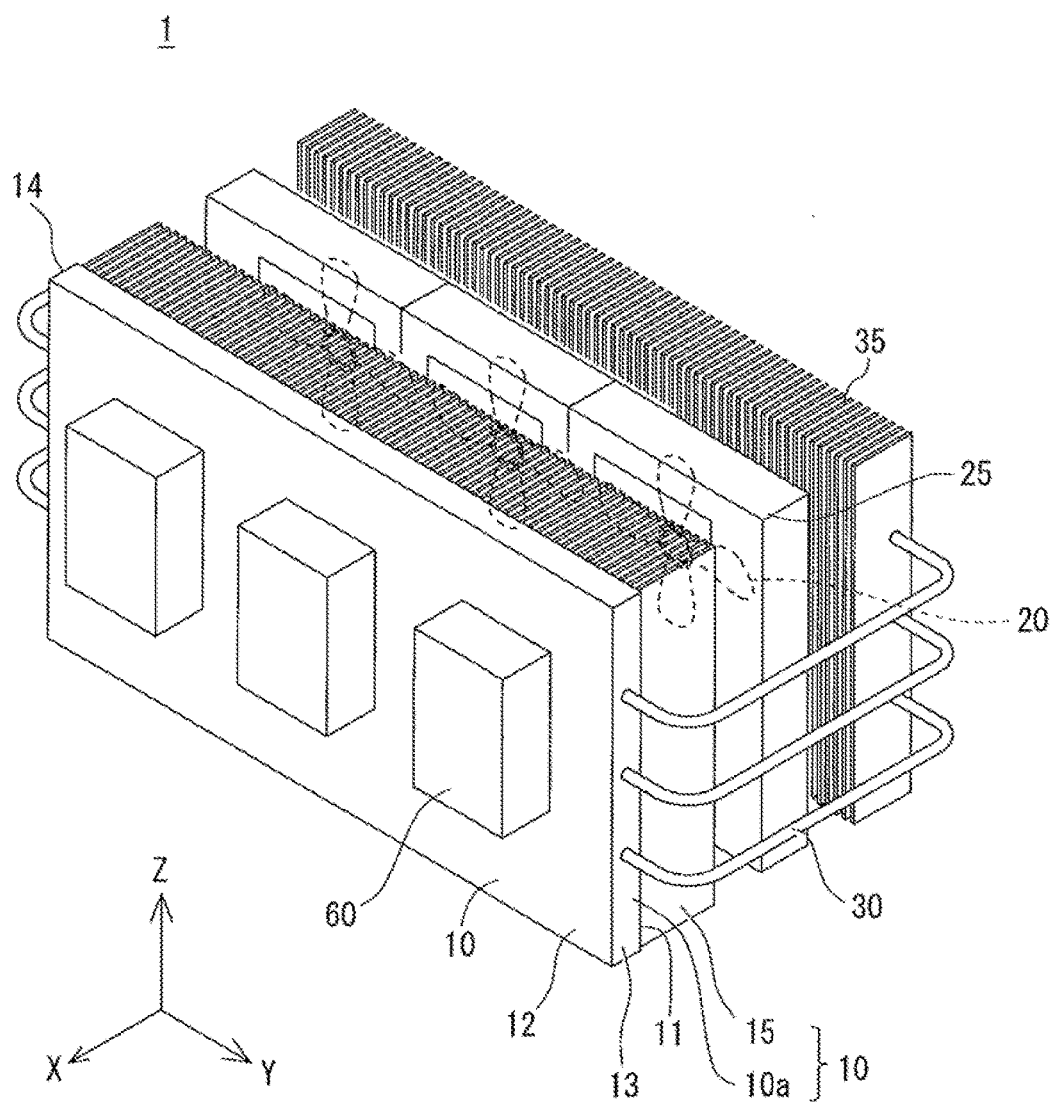
FIG. 2 is a perspective view showing an example of a cooling device according to an exemplary embodiment.
Figure 3:
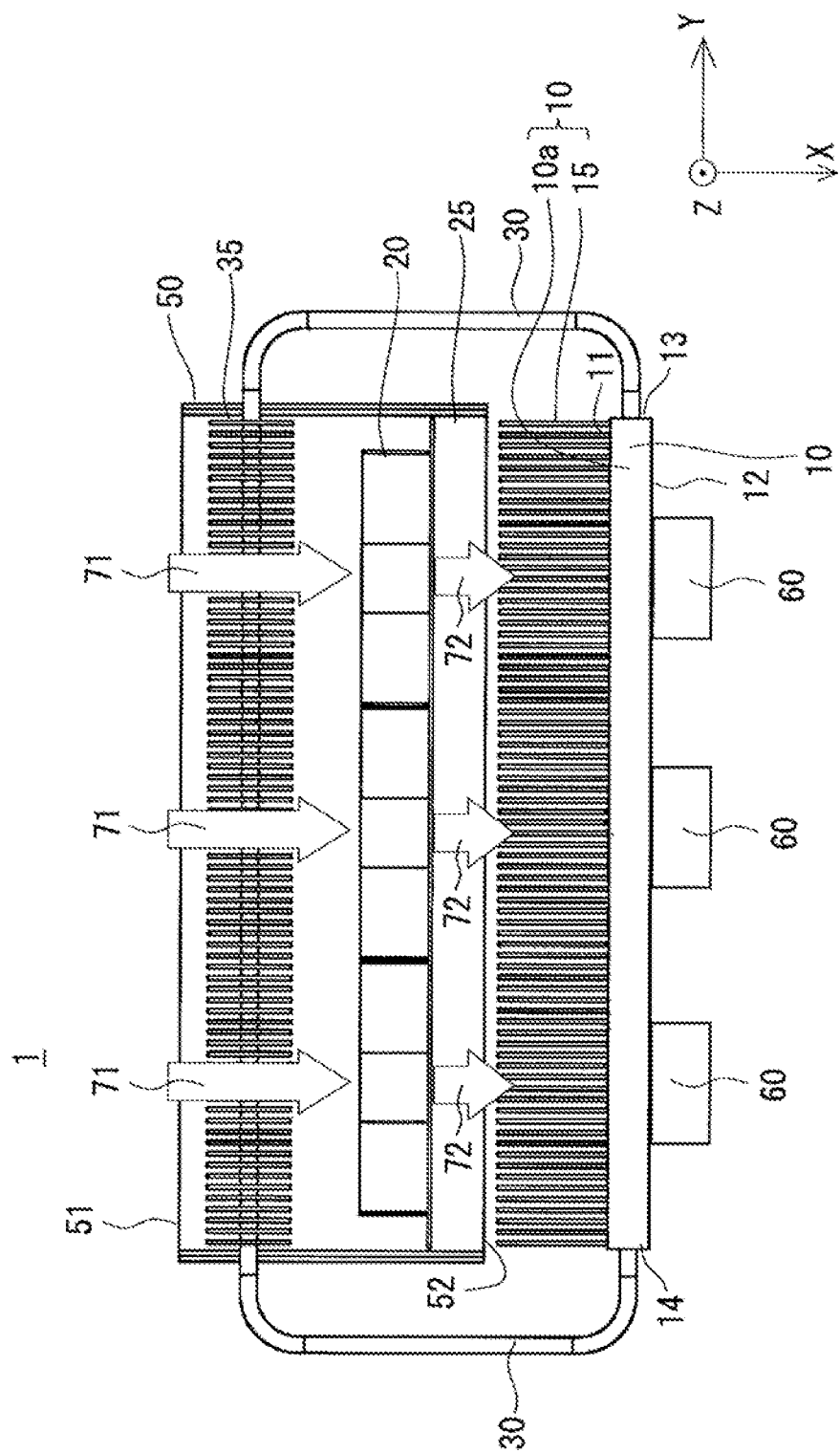
FIG. 3 is a cross section showing an example of a cooling device according to an exemplary embodiment.
Figure 4:
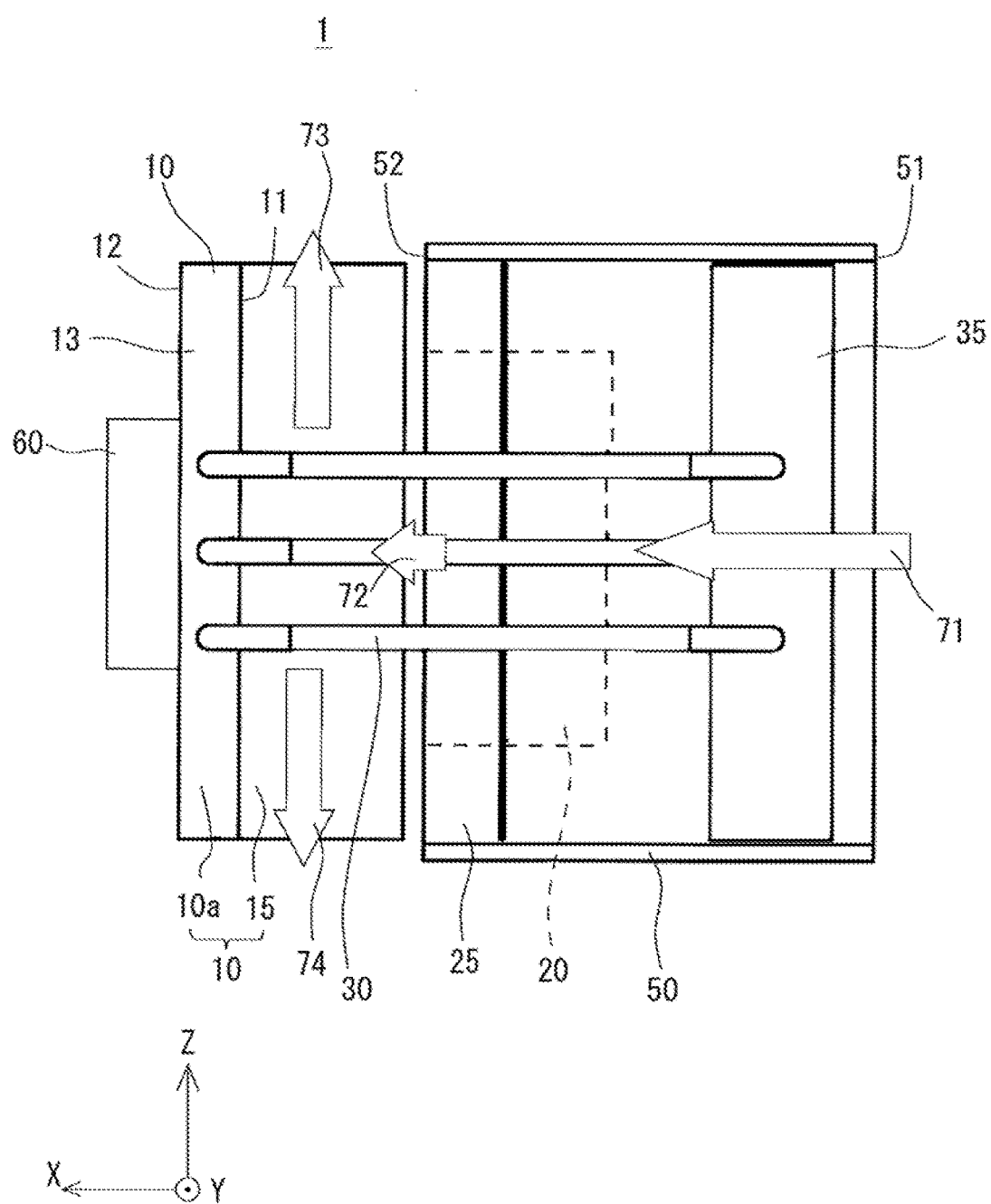
FIG. 4 is a side view of a cooling device according to an exemplary embodiment.

FIGS. 1 and 2 are perspective views showing the cooling device according to the exemplary embodiment. FIG. 3 is a cross section showing an example of the cooling device according to the exemplary embodiment. FIG. 4 is a side view of the cooling device according to the exemplary embodiment. In particular, FIG. 2 shows the inside of a duct 50 shown in FIG. 1.

As shown in FIGS. 1 to 4, a cooling device 1 according to this exemplary embodiment includes a heat sink 10, fans 20, a fan mounting unit 25, heat pipes 30, heat-pipe fins 35, and a duct 50. The cooling device 1 is a device that cools a heat source 60 in contact with the heat sink 10, such as a light source having a high thermal density. The material for the heat sink 10 and the heat-pipe fins 35 may be aluminum, copper, or the like.

The duct 50 is a rectangular-tube shaped member with opened ends (i.e., both ends of the duct 50 are opened). For example, the duct 50 is a rectangular-tube shaped member in which the shapes of its opened ends are rectangles. One of the opened ends of the duct 50 is referred to as "one end 51" and the other opened end is referred to as "other end 52".

The fans 20 are disposed inside the duct 50. The fans 20 send air present inside the duct 50. For example, the fans 20 send air in an air-sending direction that connects the one end 51 of the duct 50 with the other end 52 thereof. For example, the air-sending direction is a direction from the one end 51 toward the other end 52. The number of the fans 20 disposed inside the duct 50 may be one or more than one. The fans 20 are, for example, a plurality of propellers attached to their rotation shafts. The fans 20 send air in a direction along (or in parallel with) the rotation shafts. The fans 20 are disposed inside the duct 50 in such a manner that their rotation shafts extend along the direction from the one end 51 toward the other end 52.

Here, for the sake of explanation, an XYZ-orthogonal coordinate system is introduced in FIGS. 1 to 4. The direction in which the fans 20 disposed inside the duct 50 send air is defined as an X-axis direction. A direction on a plane orthogonal to the X-axis direction, for example, the vertical direction is defined as a Z-axis direction. A direction orthogonal to the X-axis and Z-axis directions is defined as a Y-axis direction.

The fan mounting unit 25 is disposed on the periphery of the fans 20 so as to surround the rotation shafts of the fans 20. Each of the fans 20 rotates in an internal space surrounded by the fan mounting unit 25. The fan mounting unit 25 is attached to the inner peripheral surface of the duct 50. The fan mounting unit 25 shuts out (i.e., blocks) the air flow inside the duct 50. As a result, the air that is sent from the one end 51 of the duct 50 to the other end 52 thereof passes through the parts in which the fans 20 rotate. That is, air that has flowed from the one end 51 of the duct 50 to the inside of the duct 50 flows to the other end 52 of the duct 50 through the parts which are not shut out (i.e., not blocked) by the fan mounting unit 25 and in which the fans 20 rotate. Therefore, the area (i.e., the size) of the parts in which the fans 20 rotate as viewed in the air-sending direction is smaller than the cross section of the duct 50 in the direction perpendicular to the air-sending direction.

The heat sink 10 includes a base part 10a having a first surface 11 and a second surface 12. The second surface 12 of the heat sink 10 is a surface of the heat sink 10 that is opposite to the first surface 11. The longitudinal direction of the heat sink 10 is, for example, in parallel with the Y-axis direction. In such a case, the longitudinal direction of the base part 10a is in parallel with the Y-axis direction. The length of the heat sink 10 in the Y-axis direction and the length thereof in the Z-axis direction are roughly equal to the length of the mouth of the other end 52 of the duct 50 in the Y-axis direction and the length thereof in the Z-axis direction, respectively. The first surface 11 of the heat sink 10 is opposed to the mouth of the other end 52 of the duct 50. Therefore, the base part 10a of the heat sink 10 has an opposed surface that is opposed to the mouth of the other end 52 of the duct 50 and located outside the duct 50. The heat sink 10 includes heat-sink fins 15 in addition to the base part 10a.

The heat-sink fins 15 include a plurality of thin plates. The thin plates of the heat-sink fins 15 extend from the first surface 11 of the base part 10a of the heat sink 10 toward the mouth of the other end 52 of the duct 50. Each of the thin plates of the heat-sink fins 15 is, for example, a thin-plate like member having a plate surface whose longitudinal direction is in parallel with the Z-axis direction. The thin plates of the heat-sink fins 15 have roughly the same shapes as each other. The length of the heat-sink fins 15 in the Z-axis direction is roughly equal to the length of the heat sink 10 in the Z-axis direction. Each of the thin plates of the heat-sink fins 15 is disposed along a first reference surface that is defined as a surface that intersects the first surface 11 of the base part 10a of the heat sink 10 and the mouth of the other end 52 of the duct 50. In the heat-sink fins 15, the plurality of thin plates, which extend from the opposed surface of the heat sink 10 in the air-sending direction, are apart from each other by a predetermined distance. The first reference surface is not limited to a planar surface. That is, the first reference surface intersects the mouth of the other end 52 of the duct 50 and continuously extends along the air-sending direction that is determined based on the shape of the duct 50. Therefore, the first reference surface is along (or in parallel with) the air-sending direction.

The direction that is orthogonal to each of the thin plates of the heat-sink fins 15 is the Y-axis direction. A direction orthogonal to a plate surface is referred to as a "plate-surface direction". The plate-surface direction of the heat-sink fins 15 is in parallel with the longitudinal direction of the heat sink 10. The plurality of thin plates of the heat-sink fins 15 are spaced from each other in the plate-surface direction. Therefore, grooves (i.e., gaps) between the thin plates of the heat-sink fins 15 extend in the Z-axis direction. Gaps between the thin plates of the heat-sink fins 15 are along (or in parallel with) the air-sending direction in the fans 20. That is, the plate-surface direction of the heat-sink fins 15 is roughly perpendicular to the air-sending direction.

The heat source 60 is disposed on the second surface 12 of the base part 10a of the heat sink 10 so as to be in contact with the base part 10a. For example, the heat source 60 is attached so that it is closely (or tightly) in contact with the second surface 12 of the base part 10a of the heat sink 10. The heat source 60 is, for example, a light source. More specifically, the heat source 60 is, for example, a laser light source or a semiconductor light source. The number of the heat sources 60 may be one or more than one. The heat source 60 is disposed at the center of the second surface 12 of the base part 10a. Note that the heat source 60 is not limited to the light source. That is, the heat source 60 may be an electric device that generates heat such as a CPU (Central Processing Unit).

The heat-pipe fins 35 are disposed inside the duct 50. The heat-pipe fins 35 are disposed between the fans 20 and the one end 51 of the duct 50. The heat-pipe fins 35 include a plurality of thin plates. Each of the thin plates of the heat-pipe fins 35 is, for example, a thin-plate like member having a plate surface whose longitudinal direction is in parallel with the Z-axis direction. The thin plates of the heat-pipe fins 35 have roughly the same shapes as each other. The length of the heat-pipe fins 35 in the Z-axis direction is roughly equal to the length of the heat sink 10 in the Z-axis direction.

The plate-surface direction of the heat-pipe fins 35 is in parallel with the Y-axis direction and in parallel with the longitudinal direction of the heat sink 10. The thin plates of the heat-pipe fins 35 are spaced from each other in the plate-surface direction. Gaps between the thin plates of the heat-pipe fins 35 are along (or in parallel with) the air-sending direction in the fans 20. That is, the plate-surface direction of the heat-pipe fins 35 is roughly perpendicular to the air-sending direction. Further, the plate-surface direction of the heat-sink fins 15 and the plate-surface direction of the heat-pipe fins 35 are roughly the same as each other.

The heat pipes 30 include bent parts. For example, the heat pipes 30 include curved parts. The number of the heat pipes 30 is more than one. The heat pipes 30 are connected to the heat source 60 or the heat sink 10. The heat pipes 30 are connected to both ends in the longitudinal direction of the heat sink 10 or the heat source 60. For example, the heat pipes 30 are connected to both ends in the longitudinal direction of the base part 10a. The heat pipes 30 are joined to the side surfaces 13 and 14 of the heat sink 10 and buried inside the base part 10a of the heat sink 10.

The heat pipes 30 are connected to the center in the Z-axis direction of the side surfaces 13 and 14. Further, the heat source 60 is disposed at the center of the second surface 12 of the heat sink 10. Therefore, the place where the heat pipes 30 are in contact with the heat sink 10 coincides with the place in the heat sink 10 where the heat source 60 is disposed in the Z-axis direction.

The heat pipes 30 that protrude from the side surface 13 of the heat sink 10, which is located on the positive side in the Y-axis direction, to the positive Y-axis direction are curved and extend to the negative X-axis direction. Further, the heat pipes 30 are curved to the negative Y-axis direction and inserted into the duct 50. Meanwhile, the heat pipes 30 that protrude from the side surface 14 of the heat sink 10, which is located on the negative side in the Y-axis direction, to the negative Y-axis direction are curved and extend to the negative X-axis direction. Further, the heat pipes 30 are curved to the positive Y-axis direction and inserted into the duct 50. The heat pipes 30 inserted into the duct 50 are connected to the heat-pipe fins 35 disposed inside the duct 50. The heat pipes 30 pierce the plurality of thin films of the heat-pipe fins 35 in the plate-surface direction. The parts of the heat pipes 30 other than the parts piercing the heat-pipe fins 35 are disposed outside the duct 50. Therefore, the parts of the heat pipes 30 are disposed outside the duct 50. Each of the thin plates of the heat-pipe fins 35 is disposed along a second reference surface that is defined as a surface that intersects the heat pipes 30 and the mouth of the one end 51 of the duct 50. In the heat-pipe fins 35, the plurality of thin plates, which extend from the heat pipes 30 in the air-sending direction, are apart from each other by a predetermined distance. The second reference surface is not limited to a planar surface. That is, the second reference surface intersects the mouth of the one end 51 of the duct 50 and continuously extends along the air-sending direction that is determined based on the shape of the duct 50. Therefore, the second reference surface is along (or in parallel with) the air-sending direction.

In the case where the heat source 60 is a light source of a projection display device and the light source is cooled by the cooling device 1, the projection display device includes the cooling device 1.

Next, an operation of the cooling device 1 is explained. Firstly, the heat source 60, which is disposed on the second surface 12 of the base part 10a of the heat sink 10, is started. Heat generated in the heat source 60 is transferred to the heat sink 10, with which the heat source 60 is in contact, through thermal conduction (or heat transfer). Part of the heat transferred from the heat source 60 to the heat sink 10 is radiated from the heat sink 10 itself. Further, part of the heat transferred from the heat source 60 to the heat sink 10 is radiated from the heat-sink fins 15 disposed in the heat sink 10. Further, part of the heat transferred from the heat source 60 to the heat sink 10 is further transferred to the heat pipes 30 through thermal conduction.

Part of the heat transferred from the heat source 60 to the heat pipes 30 through the heat sink 10 is radiated from the heat pipes 30 themselves. Further, part of the heat transferred from the heat source 60 to the heat pipes 30 through the heat sink 10 is further transferred to the heat-pipe fins 35 through thermal conduction. Then, the part of the heat transferred to the heat-pipe fins 35 is radiated from the heat-pipe fins 35.

Meanwhile, the fans 20 are started before or after the start of the heat source 60, or at the same time as the start of the heat source 60. As a result, air is sent in the direction from the one end 51 of the duct 50 to the other end 52 thereof inside the duct 50. That is, as shown in FIGS. 3 and 4, an air flow 71 occurs along the direction from the one end 51 of the duct 50 to the other end 52 thereof.

Air taken from the mouth of the one end 51 of the duct 50 passes through the gaps between the thin plates of the heat-pipe fins 35. The plurality of thin plates of the heat-pipe fins 35 are spaced from each other in the plate-surface direction. Further, the plate-surface direction is perpendicular to the air-sending direction. That is, the gaps between the thin plates of the heat-pipe fins 35 are along (or in parallel with) the air-sending direction. Therefore, the air that has reached the heat-pipe fins 35 passes through the gaps between the thin plates of the heat-pipe fins 35. As the air passes through the gaps between the thin plates of the heat-pipe fins 35, heat is transferred from the heat-pipe fins 35 to the flowing air. As a result, heat possessed by the heat-pipe fins 35 is radiated.

The air that has passed through the gaps between the thin plates of the heat-pipe fins 35 further passes through the parts in which the fans 20 are rotating. In the parts other than the parts in which the fans 20 are rotating in the duct 50, the air flow is shut out (i.e., blocked) by the fan mounting unit 25.

The air that has passed through the parts in which the fans 20 are rotating further advances inside the duct 50. Then, the air becomes an air flow 72 that exits from the mouth of the other end 52 of the duct 50. The base part 10a of the heat sink 10 is disposed so as to be opposed to the mouth of the other end 52 and the thin plates of the heat-sink fins 15 extend toward the mouth of the other end 52. Therefore, the air that has exited from the mouth of the other end 52 of the duct 50 passes though the gaps between the thin plates of the heat-sink fins 15. The plurality of thin plates of the heat-sink fins 15 are spaced from each other in the plate-surface direction. Further, the plate-surface direction is perpendicular to the air-sending direction. That is, the gaps between the thin plates of the heat-sink fins 15 are along (or in parallel with) the air-sending direction. Therefore, the air that has reached the heat-sink fins 15 passes through the gaps between the thin plates of the heat-sink fins 15. As the air passes through the gaps between the thin plates of the heat-sink fins 15, heat is transferred from the heat-sink fins 15 to the flowing air. As a result, heat possessed by the heat-sink fins 15 is radiated.

The air that has passed through the gaps between the thin plates of the heat-sink fins 15 is blown onto the first surface 11 of the base part 10*a* of the heat sink 10. Then, on the first surface 11 of the base part 10*a* of the heat sink 10, part of the air that has passed through the gaps between the thin plates of the heat-sink fins 15 becomes an air flow 73 flowing in the direction in which the grooves (i.e., gaps) between the thin plates of the heat-sink fins 15 extend, i.e., in the positive Z-axis direction and part of the air becomes an air flow 74 in the negative Z-axis direction. Further, each time air passes (i.e., flows) toward the positive and negative Z-axis directions, heat is transferred from the first surface 11 of the heat sink 10 to the flowing air. As a result, heat possessed by the heat sink 10 is radiated.

As described above, the heat sink 10, the heat-sink fins 15, the heat pipe 30, and heat-pipe fins 35, each of which can radiate heat by itself, can improve the cooling efficiency when there is an air flow flowing therethrough. As a result, they can radiate heat more effectively.

Next, disposition patterns A to I of the heat sink 10, the fans 20, and heat-pipe fins 35 are assumed and a simulation result for a relation between each of the disposition patterns, and the volume of air and the thermal resistance in that disposition pattern is explained. FIGS. 5(*a*) to 5(*c*) are tables showing examples of simulation results of relations between disposition patterns of the heat sink 10, the fans 20 and the heat-pipe fins 35, and the volumes of air and the thermal resistances in these disposition patterns. Note that the volume of air (hereinafter also referred to as an "air volume") means the volume of air that moves per unit time in each disposition pattern, and the thermal resistance means the thermal resistance of the heat sink 10. Further, an increase in the thermal volume means a decrease in the cooling efficiency.

A disposition pattern A shown in FIG. 5(*a*) corresponds to a case where only the fans 20 are disposed inside the duct 50, in which the ratio of the cross section of the fans 20 to the cross section of the duct 50 perpendicular to the air-sending direction (hereinafter, simply referred to as "the cross section of the duct 50") is adjusted to 1. The air volume in this state is defined as 100% and the disposition patterns A to C are compared with each other. The disposition pattern B shown in FIG. 5(*a*) corresponds to a case where the fans 20 are disposed inside the duct 50 and the heat-pipe fins 35 are disposed on the air-discharge side of the fans 20, in which the ratio of the cross section of the heat-pipe fins 35 to the cross section of the duct 50 is adjusted to 1. In this case, the air volume is 89%.

The disposition pattern C shown in FIG. 5(*a*) corresponds to a case where the fans 20 are disposed inside the duct 50 and the heat-pipe fins 35 are disposed on the air-intake side of the fans 20, in which the ratio of the cross section of the heat-pipe fins 35 to the cross section of the duct 50 is adjusted To 1. In this case, the air volume is 87%.

Regarding the relation between the fans 20 and heat-pipe fins 35, the air volume decreases when the heat-pipe fins 35 are disposed irrespective of whether the heat-pipe fins 35 are disposed on the air-intake side of the fans 20 or on the air-discharge side thereof as shown in the disposition patterns A to C shown in FIG. 5(*a*). Further, the decrease in the air volume is smaller when the heat-pipe fins 35 are disposed on the air-discharge side than when the heat-pipe fins 35 are disposed on the air-intake side.

The disposition pattern D shown in FIG. 5(*b*) corresponds to a case where only the fans 20 are disposed inside the duct 50, in which the ratio of the cross section of the fans 20 to the cross section of the duct 50 is adjusted to 0.60. The air volume in this state is defined as 100% and the disposition patterns D to F are compared with each other.

The disposition pattern E shown in FIG. 5(*b*) corresponds to a case where the fans 20 are disposed inside the duct 50 and the heat-pipe fins 35 are disposed on the air-discharge side of the fans 20, in which the ratio of the cross section of the heat-pipe fins 35 to the cross section of the duct 50 is adjusted to 1. Therefore, the ratio of the cross section of the heat-pipe fins 35 to the cross section of the fans 20 is 1.65. In this case, the air volume is 94%.

The disposition pattern F shown in FIG. 5(*b*) corresponds to a case where the fans 20 are disposed inside the duct 50 and the heat-pipe fins 35 are disposed on the air-intake side of the fans 20, in which the ratio of the cross section of the heat-pipe fins 35 to the cross section of the duct 50 is adjusted to 1. Therefore, the ratio of the cross section of the heat-pipe fins 35 to the cross section of the fans 20 is 1.65. In this case, the air volume is 92%.

As shown in the disposition patterns D to F shown in FIG. 5(*b*), when the cross section of the duct 50 is increased, the decrease in the air volume can be reduced in comparison to the disposition patterns A to C. Further, similarly to the disposition patterns A to C, the air volume decreases when the heat-pipe fins 35 are disposed irrespective of whether the heat-pipe fins 35 are disposed on the air-intake side of the fans 20 or on the air-discharge side thereof. Further, similarly to the disposition patterns A to C, the decrease in the air volume is smaller when the heat-pipe fins 35 are disposed on the air-discharge side than when the heat-pipe fins 35 are disposed on the air-intake side.

The disposition pattern G shown in FIG. 5(*c*) corresponds to a case where the fans 20 are disposed inside the duct 50 and the heat sink 10 is disposed so as to be opposed to the mouth of the other end 52 of the duct 50, in which the ratio of the cross section of the fans 20 to the cross section of the duct 50 is adjusted to 0.60. The air volume in this state is defined as 100%. Further, the thermal resistance in this state is defined as 100% and the disposition patterns G to I are compared with each other.

The disposition pattern H shown in FIG. 5(*c*) corresponds to a case where: the fans 20 are disposed inside the duct 50; the heat-pipe fins 35 are disposed on the air-discharge side of the fans 20; and the heat sink 10 is disposed so as to be opposed to the mouth of the other end 52 of the duct 50. Further, the ratio of the cross section of the heat-pipe fins 35 to the cross section of the duct 50 is adjusted to 1. The ratio of the cross section of the heat-pipe fins 35 to the cross section of the fans 20 is 1.65. In this case, the air volume is 92%. Further, the thermal resistance in this case is 109%.

The disposition pattern I shown in FIG. 5(*c*) corresponds to a case where: the fans 20 are disposed inside the duct 50; the heat-pipe fins 35 are disposed on the air-intake side of the fans 20; and the heat sink 10 is disposed so as to be opposed to the mouth of the other end 52 of the duct 50. The ratio of the cross section of the heat-pipe fins 35 to the cross section of the duct 50 is adjusted to 1. The ratio of the cross section of the heat-pipe fins 35 to the cross section of the fans 20 is 1.65. In this case, the air volume is 94%. Further, the thermal resistance in this case is 104%.

As shown in the disposition patterns G to I shown in FIG. 5(*c*), when the heat sink 10 is disposed so as to be opposed to the mouth of the other end 52 of the duct 50, the air volume decreases when the heat-pipe fins 35 are disposed irrespective of whether the heat-pipe fins 35 are disposed on the air-intake side of the fans 20 or on the air-discharge side thereof. However, the decrease in the air volume is smaller when the heat-pipe fins 35 are disposed on the air-intake side than when the heat-pipe fins 35 are disposed on the air-discharge side.

The reason why the thermal resistances of the heat sink 10 are compared in the comparison among the disposition patterns G to I is explained hereinafter. In general, the thermal resistance of the heat pipes 30 is sufficiently smaller than that of the heat sink 10 and heat is efficiently transferred to the heat-pipe fins 35. Therefore, the thermal resistance of the heat-pipe fins 35 does not widely change. In contrast to this, the thermal resistance of the heat sink 10 changes according to the change in the air flow to the heat sink 10, which is caused by the flow-channel resistance that occurs when air moves through the flow channel formed by the gaps between the thin plates of the heat-pipe fins 35. Therefore, the thermal resistances of the heat sink 10 are compared with each other.

The reason why the changes in the air volume and in the thermal resistance in the disposition pattern I are small is explained hereinafter. Firstly, the disposition patterns G to I differ from the disposition patterns A to F in regard to the presence/absence of the heat sink 10. Next, among the disposition patterns G to I, the disposition pattern I, in which the heat sink 10, which causes a flow-channel resistance, is disposed on the air-discharge side of the fans 20, has a configuration in which the fans 20 are disposed between the flow-channel resistance of the heat sink 10 and the flow-channel resistance of the heat-pipe fins 35. In general, the air volume tends to decrease when there is a flow-channel resistance on the discharge side of the fans 20. The disposition pattern I is the only disposition pattern in which there are flow-channel resistances on both of the air-intake side and the air-discharge side of the fans 20. That is, in the disposition pattern I, since the flow-channel resistance of the heat sink 10 on the air-discharge side of the fans 20 as well as the flow-channel resistance of the heat-pipe fins 35 on the air-intake side are added, the balance between the air-intake side of the fans 20 and the air-discharge side thereof is improved. It is indicated that, as a result, the decrease in the air volume can be reduced and the increase in the thermal resistance can also be reduced. It should be noted that the among the disposition patterns A to I, only the disposition patterns A and I have an excellent balance between the air-intake side and the air-discharge side. Therefore, among the disposition patterns B to I, the disposition pattern I can achieve the movement of air that is closest to the movement of air in the disposition pattern A.

Therefore, when a component that causes a flow-channel resistance such as the heat sink 10 is disposed as in the case of this exemplary embodiment, the cooling efficiency can be improved by disposing the heat-pipe fins 35 on the air-intake side.

Further, in this exemplary embodiment, part of the heat of the heat sink 10 is divided (i.e., transferred) to the heat-pipe fins 35 by using the heat pipes 30. Then, the heat is radiated from both the heat sink 10 and the heat-pipe fins 35. In this way, it is possible to prevent the air volume from being reduced and improve the cooling efficiency.

Next, advantageous effects of this exemplary embodiment will be explained. However, before the explanation of advantageous effects, comparative examples are explained. Then after that, the advantageous effects of this exemplary embodiment are explained while comparing them with those of the comparative examples.

Figure 6:
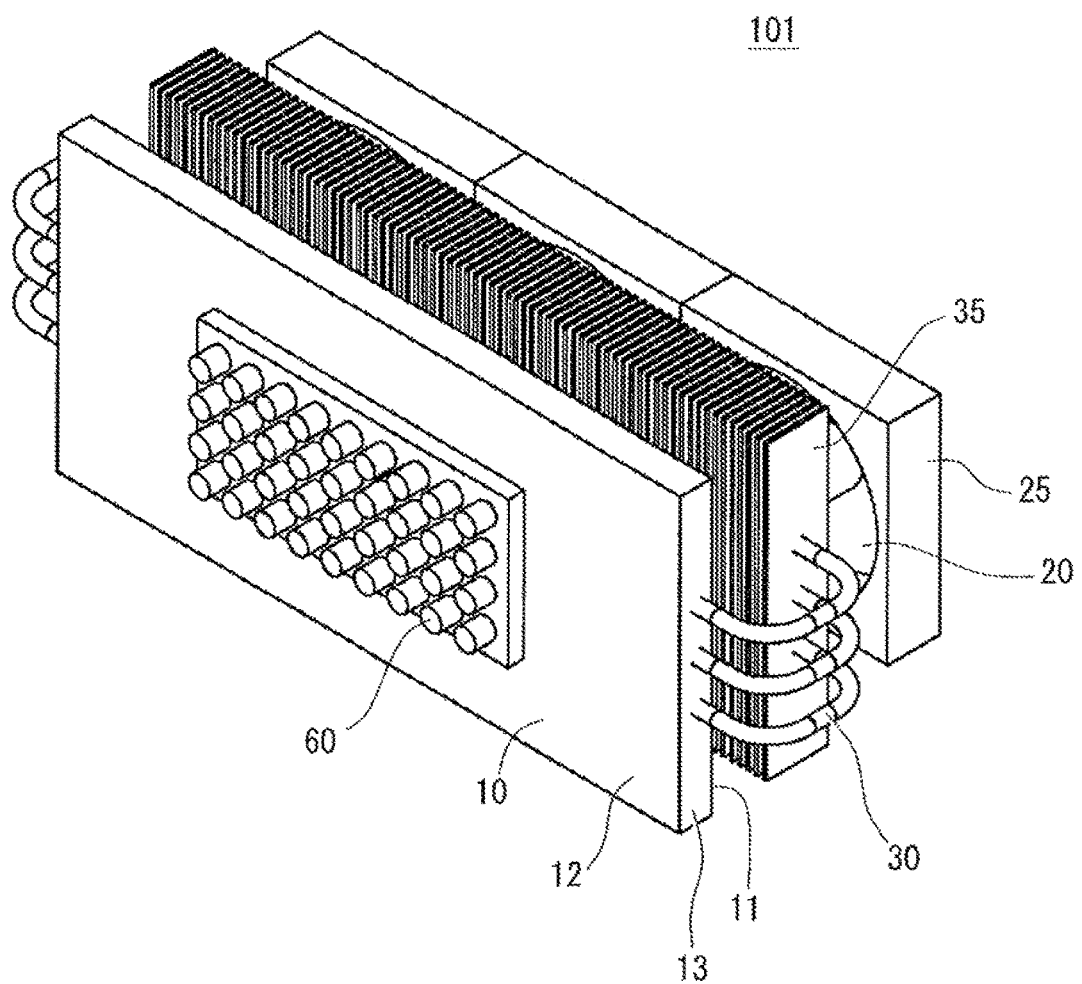
FIG. 6 is a perspective view showing an example of a cooling device according to a comparative example 1.

FIG. 6 is a perspective view showing an example of a cooling device according to a comparative example 1. As show in FIG. 6, a cooling device 101 according to the comparative example 1 includes a heat sink 10, fans 20, heat pipes 30, and heat-pipe fins 35. However, the heat sink 10 has no heat sink fin 15. Further, the heat-pipe fins 35 are disposed on the air-discharge side of the fans 20.

As shown in FIG. 5, since the heat-pipe fins 35 are not disposed on the air-intake side of the fans 20 in the cooling device 101 according to the comparative example 1, the air volume decreases and the cooling efficiency cannot be improved. Further, the increase in the thermal resistance cannot be prevented. Since no heat is radiated from heat-sink fins 15, the cooling performance of the cooling device 101 is poorer than that in the disposition pattern I according to the exemplary embodiment.

Figure 7:
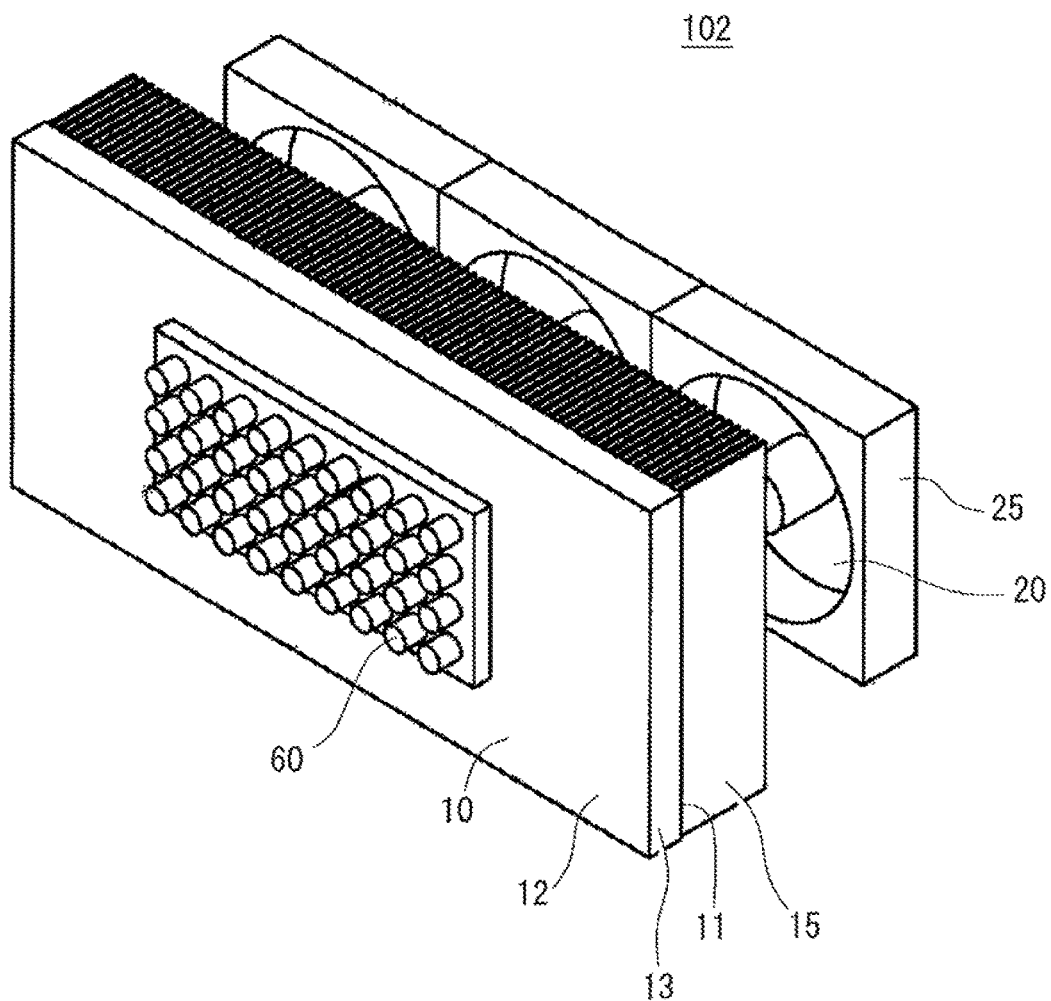
FIG. 7 is a perspective view showing an example of a cooling device according to a comparative example 2.
Figure 8A:
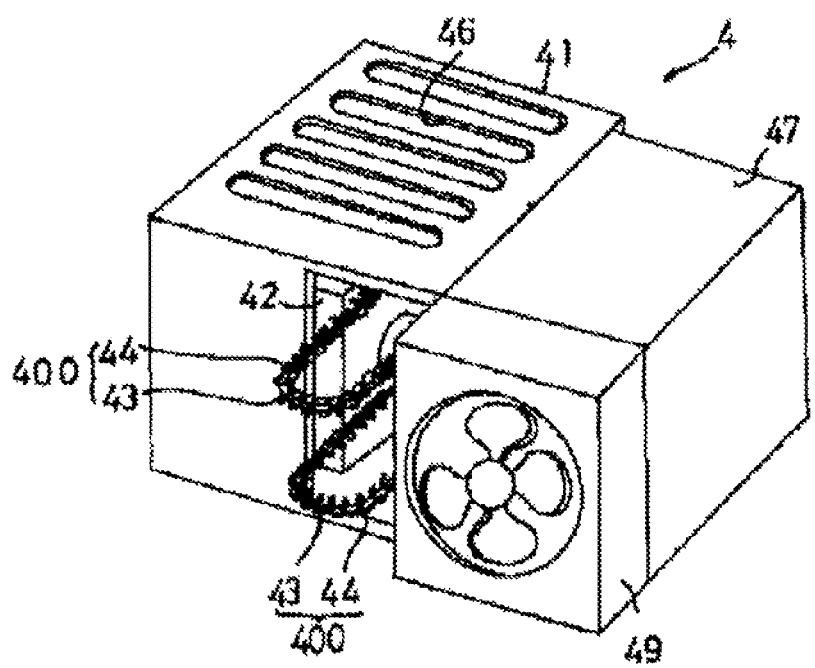
FIG. 8A shows an example of a projection display device in a related art.
Figure 8B:
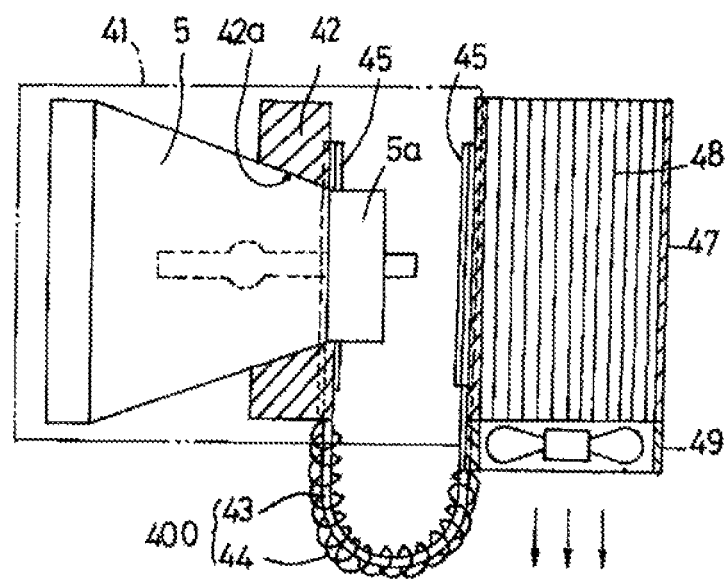
FIG. 8B shows an example of a projection display device in a related art.

FIG. 7 is a perspective view showing an example of a cooling device according to a comparative example 2. As show in FIG. 7, a cooling device 102 according to the comparative example 2 includes a heat sink 10, heat-sink fins 15, and fans 20. However, the cooling device 102 according to the comparative example 2 has no heat pipe 30 and no heat pipe fin 35. Therefore, the cooling device 102 cannot divide (i.e., transfer) the heat transferred to the heat sink 10 to other radiating parts. Therefore, even when the size of the heat sink 10 is increased, the radiation efficiency does not improve when the size of the heat sink 10 reaches a certain size and the radiation efficiency saturates there. Consequently, the cooling efficiency cannot be improved.

Next, advantageous effects of the exemplary embodiment are explained. The cooling device 1 according to this exemplary embodiment divides the radiation part for radiating the heat generated in the heat source 60 into the heat sink 10 connected to the heat source 60 and the heat-pipe fins 35 connected to the heat source 60 through the heat sink 10 and the heat pipes 30. In this way, the cooling efficiency can be improved without increasing the size of the heat sink 10. As a result, it is possible to prevent the saturation of the radiation efficiency.

Further, in the cooling device 1, the heat-pipe fins 35, the fans 20, and the heat sink 10 are arranged in this order from the air-intake side. As shown in FIGS. 5(a) to 5(c), when there is a structure (e.g., a flow-channel resistance) that interferes with the air flow such as the heat-sink fins 15 near the mouth on the air-discharge side of the duct 50, it is possible to prevent the increase in the thermal resistance while preventing the decrease in the air volume by disposing the heat-pipe fins 35 on the air-intake side of the fans 20 rather than disposing them on the air-discharge side of the fans 20. Further, when there is a flow-channel resistance on the air-discharge side of the fans 20, it is possible to efficiently send air while preventing the flow speed from being reduced by disposing the fans 20 near the heat-sink fins 15. As described above, in the cooling device 1, it is preferable that the fans 20 are disposed between the heat-pipe fins 35 and the heat sink 10, and hence the heat-pipe fins 35, the fans 20, and the heat sink 10 are disposed in this order from the air-intake side.

The plate-surface direction of the heat-sink fins 15 is roughly the same as the plate-surface direction of the heat-pipe fins 35 and these directions are perpendicular to the air-sending direction. As a result, it is possible to expedite (or increase) the contact between the heat-sink fins 15 and the air and between the heat-pipe fins 35 and the air, thus making it possible to improve the cooling performance while preventing the decrease in the air volume.

The number of the heat pipes 30 connected to the heat sink 10 is more than one, e.g., three. In this way, it is possible to increase the amount of heat transferred from the heat sink 10 to the heat-pipe fins 35.

Further, the heat pipes 30 are connected to both ends in the longitudinal direction or the crosswise direction (or widthwise direction) of the heat sink 10. More preferably, the heat pipes 30 are connected to both ends in the longitudinal direction of the heat sink 10 rather than in the crosswise direction thereof. In this way, the heat of the heat sink 10 can be uniformly transferred to the heat pipes 30. As a result, compared to the case where the heat pipes 30 are connected to only one end 51 in the longitudinal direction of the heat sink 10, the imbalance in the cooling of the heat source 60 can be prevented (or reduced) more effectively especially when the heat source 60 is a light source having a high thermal density.

In this exemplary embodiment, the plate-surface directions of the heat-sink fins 15 and the heat-pipe fins 35 are both in parallel with the longitudinal direction of the heat sink 10. Therefore, the air that has exited from the mouth of the other end 52 of the duct 50 flows along the crosswise direction (or widthwise direction) of the heat sink 10. As a result, the attenuation (i.e., the decrease) in the air volume can be prevented.

Note that the plate-surface direction of the heat-sink fins 15 may be in parallel with the Z-axis direction and the plate-surface direction of the heat-pipe fins 35 may be in parallel with the Y-axis direction. Further, the heat pipes 30 may be connected to both ends in the Y-axis direction of the heat sink 10. In such a case, the air-sending direction of the air that has exited from the mouth of the other end 52 of the duct 50 is changed to the Y-axis direction by the heat sink 10. Then, the air passes through the gaps of the heat-sink fins 15 and exits from both ends in the Y-axis direction of the heat sink 10. Note that since the heat pipes 30 are connected to both ends in the Y-axis direction of the heat sink 10, the air that has exited from both ends in the Y-axis direction of the heat sink 10 comes into contact with heat pipes 30. As a result, the air that has come into contact with the heat pipes 30 causes heat in the heat pipes 30 to radiate therefrom (i.e., absorbs heat from the heat pipes 30). Consequently, the cooling efficiency can be improved even further.

Note that although the duct 50 has a rectangular-tube shape extending in the X-axis direction in the above-described example, the shape of the duct 50 is not limited to this shape. The duct 50 may have a cylindrical shape extending in the X-axis direction and the mouth of the one end 51 of the duct 50 may have an arbitrary shape. In such a case, the heat sink 10 and the heat-pipe fins 35 are shaped so that their shapes conform to the shape of the mouth of the one end 51 of the duct 50. Further, although the duct 50 has a tubular shape extending in one direction in the above-described example, the duct 50 may have a curved tubular shape. In such a case, the fans 20 send air so that the air-sending direction is along (in parallel with) the shape of the duct 50.

Note that the first and second reference surfaces, based on which the surface shapes of the heat-sink fins 15 and the heat-pipe fins 35, respectively, are determined, may have such shapes that they are continuously connected with respect to the shape of the duct 50.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A cooling device comprising:
    a duct with one opened end and another opened end;
    a fan disposed inside the duct, the fan being configured to send air present inside the duct in an air-sending direction, the air sending direction being a direction connecting the one opened end of the duct with the another opened end thereof;
    a heat sink disposed outside the duct, the heat sink comprising a base part having an opposed surface opposed to a mouth of the another end of the duct, and heat-sink fins comprising a plurality of thin plates extending from the opposed surface along the air-sending direction, the plurality of thin plates being apart from each other by a predetermined distance;
    a heat source in contact with the base part;
    a heat pipe connected to the heat source or the heat sink; and
    heat-pipe fins disposed between the fan and the one end of the duct inside the duct, the heat-pipe fins comprising a plurality of thin plates extending from the heat pipe along the air-sending direction, the plurality of thin plates being apart from each other by a predetermined distance,
    wherein
    the base part has a shape having a longitudinal direction, and
    the heat pipe is connected to both ends in the longitudinal direction of the base part.

2. The cooling device according to claim 1, wherein the air-sending direction is a direction from the one opened end of the duct toward the another opened end thereof.

3. The cooling device according to claim 1, wherein a part of the heat pipe is disposed outside the duct.

4. The cooling device according to claim 1, wherein a plate-surface direction of the heat-sink fins is in parallel with the longitudinal direction of the base part.

5. A projection display device comprising the cooling device according to claim 1.

6. A cooling device comprising:
    a duct with one opened end and another opened end;
    a fan disposed inside the duct, the fan attached to the inner peripheral surface of the duct, the fan being configured to send air present inside the duct in an air-sending direction, the air sending direction being a direction connecting the one opened end of the duct with the another opened end thereof;
    a heat sink disposed outside the duct, the heat sink comprising a base part having an opposed surface opposed to a mouth of the another end of the duct, and heat-sink fins comprising a plurality of thin plates extending from the opposed surface along the air-sending direction, the plurality of thin plates being apart from each other by a predetermined distance;
    a heat source in contact with the base part;
    a heat pipe connected to the heat source or the heat sink; and
    heat-pipe fins disposed between the fan and the one end of the duct inside the duct, the heat-pipe fins comprising a plurality of thin plates extending from the heat pipe along the air-sending direction, the plurality of thin plates being apart from each other by a predetermined distance.

7. A cooling device comprising:

a duct with one opened end and another opened end;

a fan disposed inside the duct, the fan being configured to send air present inside the duct in an air-sending direction, the air sending direction being a horizontal direction connecting the one opened end of the duct with the another opened end thereof;

a heat sink disposed outside the duct, the heat sink comprising a base part having an opposed surface opposed to a mouth of the another end of the duct, and heat-sink fins comprising a plurality of thin plates extending from the opposed surface along the air-sending direction, the plurality of thin plates being apart from each other by a predetermined distance;

a heat source in contact with the base part;

a heat pipe connected to the heat source or the heat sink; and heat-pipe fins disposed between the fan and the one end of the duct inside the duct, the heat-pipe fins comprising a plurality of thin plates extending from the heat pipe along the air-sending direction, the plurality of thin plates being apart from each other by a predetermined distance.

\* \* \* \* \*